(12) United States Patent
Lee et al.

(10) Patent No.: US 7,814,379 B2
(45) Date of Patent: Oct. 12, 2010

(54) MEMORY MODULE PACKAGING TEST SYSTEM

(75) Inventors: Jung-kuk Lee, Yongin-si (KR);
You-keun Han, Yongin-si (KR);
Hui-chong Shin, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 655 days.

(21) Appl. No.: 11/812,578

(22) Filed: Jun. 20, 2007

(65) Prior Publication Data

US 2008/0016400 A1 Jan. 17, 2008

(30) Foreign Application Priority Data

Jul. 13, 2006 (KR) ................ 10-2006-0065868

(51) Int. Cl.
*G11C 29/00* (2006.01)
*G01R 31/02* (2006.01)
(52) U.S. Cl. ...................... 714/718; 324/754
(58) Field of Classification Search ............... 714/718; 324/754

See application file for complete search history.

(56) References Cited

U.S. PATENT DOCUMENTS 6,357,022 B1    3/2002  Nguyen et al.

FOREIGN PATENT DOCUMENTS

| KR | 10-2001-0096954 | 11/2001 |
| KR | 10-2003-0017053 | 3/2003 |
| KR | 100459867 | 12/2004 |
| KR | 100549425 | 1/2006 |

OTHER PUBLICATIONS

Korean Office Action dated Oct. 12, 2007.

*Primary Examiner*—James C Kerveros
(74) *Attorney, Agent, or Firm*—Harness, Dickey & Pierce, P.L.C.

(57) ABSTRACT

A memory module packaging test system may include a plurality of test slots into which a plurality of memory modules may be installed so that the system may simultaneously test the memory modules. The memory module packaging test system may use a server system for a registered dual in-line memory module (RDIMM) or a fully buffered dual in-line memory module (FBDIMM) so that the system may test an unbuffered dual in-line memory module (UDIMM).

18 Claims, 5 Drawing Sheets

MEMORY MODULE PACKAGING TEST SYSTEM

CROSS-REFERENCE TO RELATED PATENT APPLICATION

This application claims the benefit of Korean Patent Application No. 10-2006-0065868, filed on Jul. 13, 2006, in the Korean Intellectual Property Office, the disclosure of which is incorporated herein in its entirety by reference.

BACKGROUND

1. Field

Example embodiments relate to a memory module test, and more particularly, to a memory module packaging test system.

2. Description of the Related Art

Various types of semiconductor chips may be used to form modules, even if the chips can be operated independently. An example of these modules is a memory module comprising several memory chips.

The characteristics of memory modules may be tested to confirm whether the memory modules are operating properly. Testing techniques may involve using a memory test device, and/or memory modules may be packaged in a test system.

Memory modules may not be tested in an environment where memory modules are installed, but in a separate experimental environment using the memory test device. Such testing may not provide accurate results because the characteristics of the memory modules, such as noise in the environment where memory modules are installed (for example) may not be present. Therefore, a memory module packaging test method, which is known in the art, may be implemented.

Although conventional testing techniques may provide acceptable performance, they are not without shortcomings. For example, the capacity of memory modules may increase, and therefore the time required to test memory modules may increase, and the mass production of memory modules may be difficult. Also, fast unbuffered dual in-line memory modules (UDIMM) may not be tested using a conventional memory module packaging test method as the operation speed of the memory modules may be increased.

SUMMARY

According to an example, non-limiting embodiment, a memory module packaging test system may have a motherboard including a module socket, and a test board including a plurality of test sockets into which memory modules may be respectively insertable. A connector mechanism may electrically connect together the motherboard and the test board. Either a phase locked loop (PLL) and a register, or an advanced memory buffer (AMB) may be electrically interconnected between the module socket and the plurality of test sockets.

According to another example, non-limiting embodiments, a memory module packaging test system may have a motherboard including a module socket, and a test board. The test board may have an upper surface supporting a plurality of test sockets into which memory modules are respectively insertable, and a bottom surface supporting an interface socket that may be electrically connected to the test sockets. An interface board may be disposed between the module socket of the motherboard and the interface socket of the test board.

According to another example, non-limiting embodiment, a memory module packaging test system may have a motherboard including a module socket, and a test board. The test board may have an upper surface supporting a plurality of test sockets into which memory modules are respectively insertable, and a bottom surface supporting an interface socket electrically connected to the test sockets. An interface board may be disposed between the module socket of the motherboard and the interface socket of the test board. Either a phase locked loop (PLL) and a register, or an advanced memory buffer (AMB) may be electrically interconnected between the module socket and the plurality of test sockets.

BRIEF DESCRIPTION OF THE DRAWINGS

Example, non-limiting embodiments will be described with reference to the attached drawings.

DESCRIPTION OF EXAMPLE

Non-Limiting Embodiments

Figure 1:
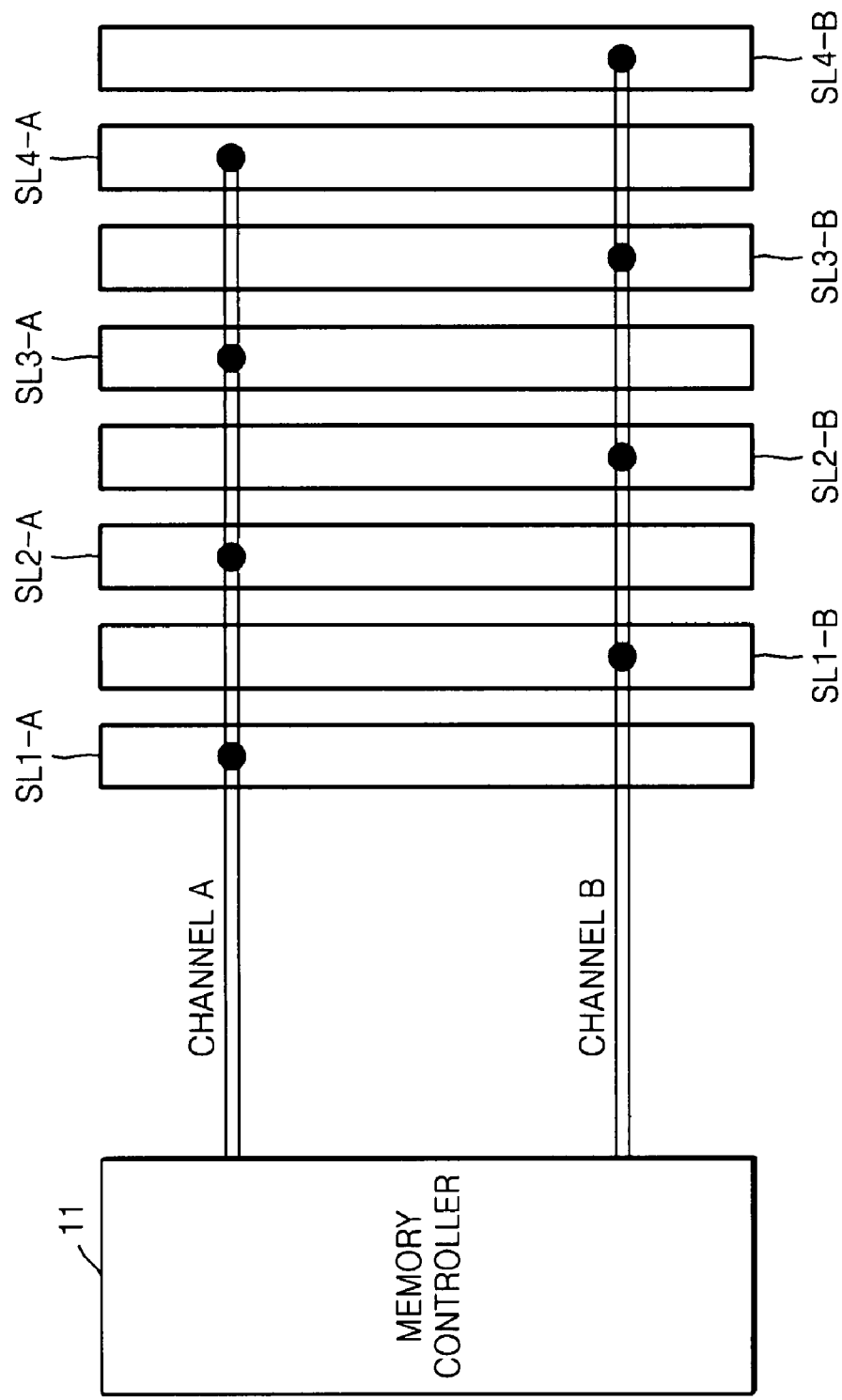
FIG. 1 is a schematic block diagram of a conventional memory system.

Example, non-limiting embodiments will be described with reference to the accompanying drawings. Like reference numerals in the drawings denote like elements, and thus their description may be omitted.

An element is considered as being mounted (or provided) "on" another element when mounted (or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

FIG. 1 is a block diagram of a conventional memory system. A memory module packaging test system according to example embodiments will be described based on the conventional memory system illustrated in FIG. 1. Referring to FIG. 1, the memory system may use two channels A and B into which a plurality of memory module slots may be formed. The plurality of memory module slots SL1-A, SL2-A, SL3-A, and SL4-A may be formed in channel A, and the plurality of memory module slots SL1-B, SL2-B, SL3-B, and SL4-B may be formed in channel B. The two channels A and B may be connected to a memory controller 11. Memory modules may be respectively inserted into the memory module slots SL1-A, SL2-A, SL3-A, SL4-A, SL1-B, SL2-B, SL3-B, and SL4-B.

Figure 2:
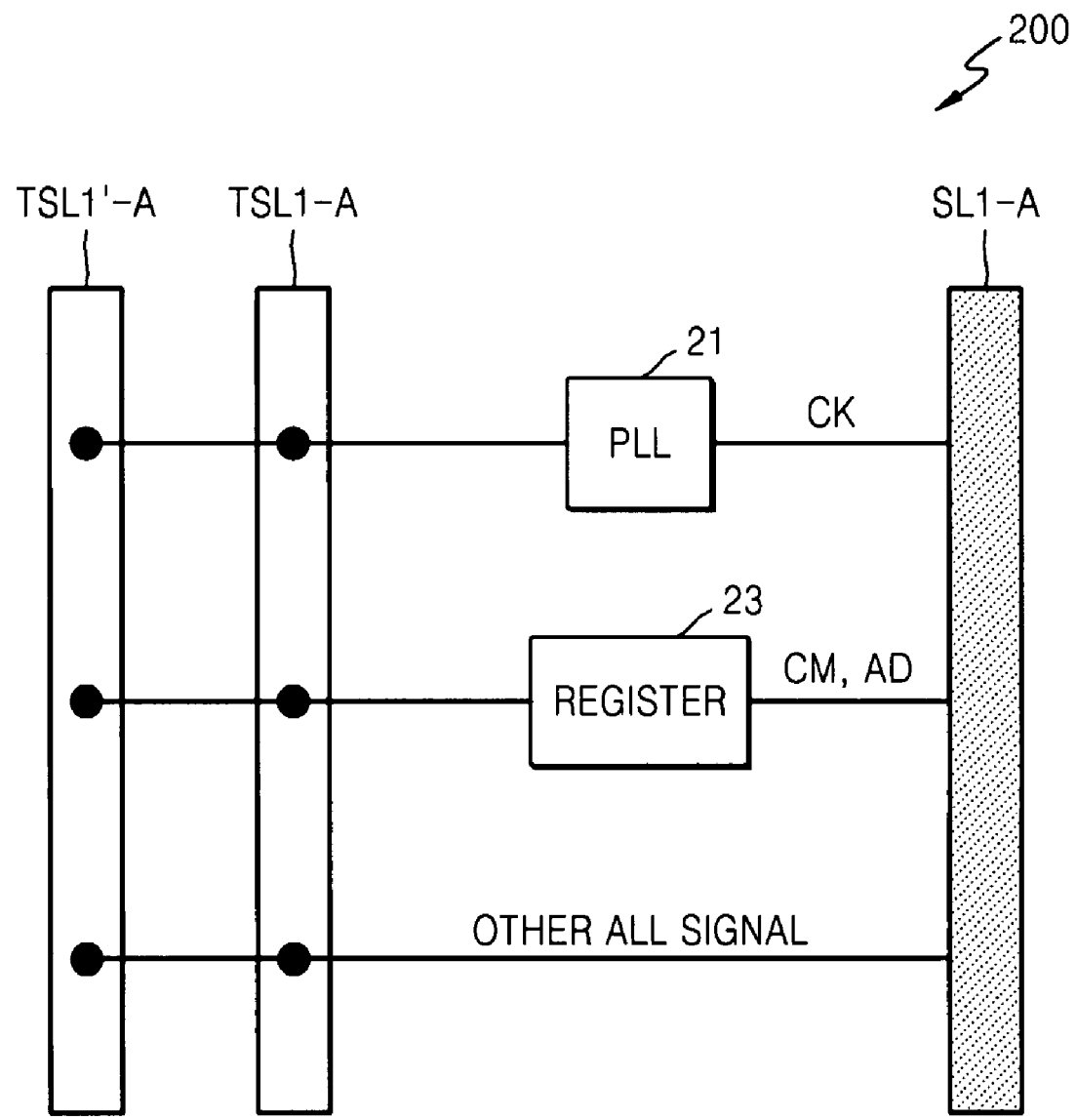
FIG. 2 is a schematic block diagram of a memory module packaging test system according to an example embodiment.

FIG. 2 is a schematic block diagram of a memory module packaging test system 200 according to an example embodiment. The memory module packaging test system 200 may use a server system for a registered dual in-line memory module (RDIMM). The memory module packaging test system 200 will be described in relation to channel A illustrated in FIG. 1.

Referring to FIG. 2, in the memory module packaging test system 200, two test slots TSL1-A and TSL1'-A may be connected to a memory module slot SL1-A and may share signals from the memory module slot SL1-A. In alternative embodiment, three or more test slots may be connected to the memory module slot SL1-A.

Two memory modules may be respectively mounted in the two test slots TSL1-A and TSL1'-A. In this way, the two memory modules may be simultaneously tested, which may reduce the time required to test the two memory modules.

A phase locked loop (PLL) 21 and a register 23 may be interconnected between the memory module slot SL1-A and the test slots TSL1-A and TSL1'-A to correct the AC characteristics (e.g., delay time, etc.) of signals. By way of example only, the PLL 21 may correct the AC characteristics of a clock signal CL from the memory module slot SL1-A, and the register 23 may compensate for the AC characteristics of a command CM and/or an address AD from the memory module slot SL1-A. The structural and functional aspects of the PLL 21 and the register 23 per se are well known to those skilled in the pertinent art, and thus a detailed description of the same is omitted.

The memory module packaging test system 200 may include the PLL 21 and the register 23 to correct the AC characteristics of signals. Therefore, even if the memory module slot SL1-A supports an RDIMM interface, the memory module packaging test system 200 may be tested by inserting a fast unbuffered dual in-line memory modules (UDIMM) into the test slots TSL1-A and TSL1'-A. For example, because the memory module packaging test system 200 may include the PLL 21 and the register 23, even if the memory module slot SL1-A may be used for the RDIMM, the memory module packaging test system 200 may be tested by operating the UDIMM inserted into the test slots TSL1-A and TSL1'-A as the RDIMM. By way of example only, the memory module packaging test system 200 may test the UDIMM at 800 Mbps because the RDIMM may cover 667 Mbps and 800 Mbps.

Figure 3:
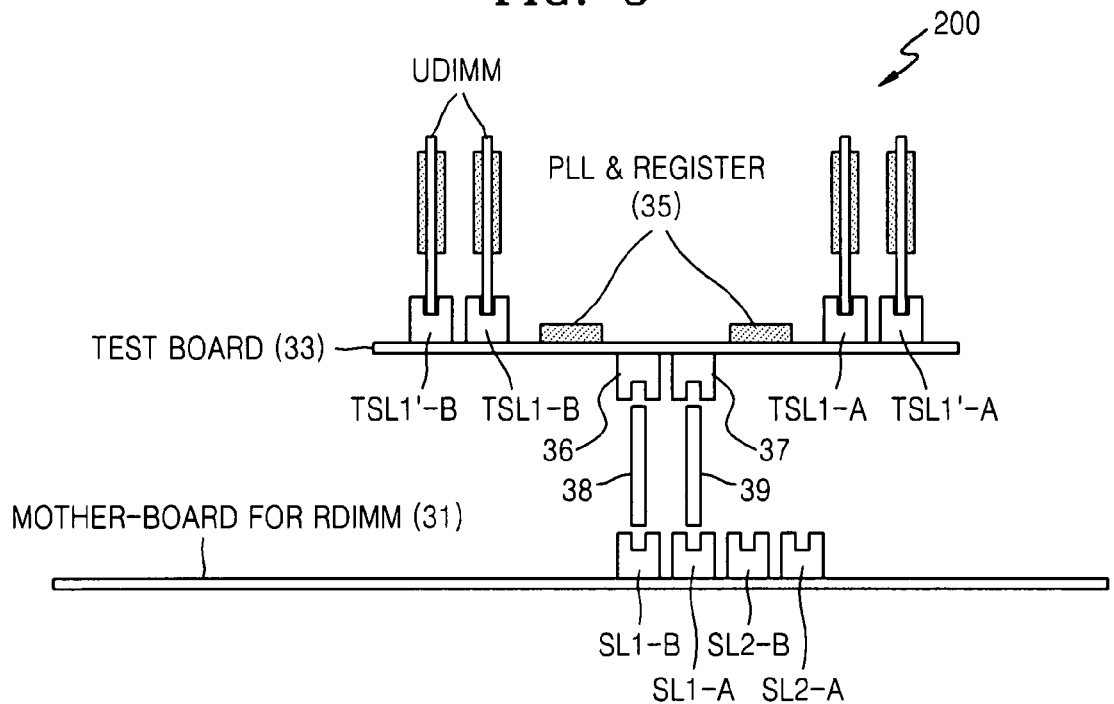
FIG. 3 is an example schematic diagram of a memory module packaging test system illustrated in FIG. 2.

FIG. 3 is an example schematic diagram of the memory module packaging test system 200 illustrated in FIG. 2. The memory module packaging test system 200 may use a server system for a RDIMM without any modification.

Referring to FIG. 3, the memory module packaging test system 200 may include a mother board 31 for the RDIMM. The mother board 31 may support a plurality of module sockets SL1-A, SL2-A, SL1-B, and SL2-B. The memory module packaging test system 200 may also include a test board 33 that may support a plurality of test sockets TSL1-A, TSL1'-A, TSL1-B, and TSL1'-B into which UDIMMs may be inserted. A PLL/register 35 may be mounted on the test board 33 to correct the AC characteristics (e.g., delay time, etc.) of signals.

The memory module packaging test system 200 may include interface sockets 36 and 37 and interface boards 38 and 39 electrically connecting together the mother board 31 and the test board 33. The interface sockets 36 and 37 may be disposed on the bottom surface of the test board 33, and may be electrically connected with the PLL/register 35 and the test sockets TSL1-A, TSL1'-A, TSL1-B, and TSL1'-B. The interface boards 38 and 39 may be inserted into the interface sockets 36 and 37 and the module sockets SL1-A, SL2-A, SL1-B, and SL2-B to provide an interconnection therebetween. In alternative embodiments, the PLL/register 35 may be mounted in the interface boards 38 and 39 (instead of the test board 33).

The module sockets SL1-A and SL2-A mounted on the motherboard 31 and the test sockets TSL1-A and TSL1'-A mounted on the test board 33 may be connected to channel A illustrated in FIG. 1. The module sockets SL1-B and SL2-B mounted on the motherboard 31 and the test sockets TSL1-B and TSL1'-B mounted on the test board 33 may be connected to channel B illustrated in FIG. 1. The module socket SL1-A may correspond to the memory module slot SL1-A illustrated in FIG. 2. The PLL/register 35 may correspond to the PLL 21 and the register 23 illustrated in FIG. 2. The test sockets TSL1-A and TSL1'-A may correspond to the test slots TSL1-A and TSL1'-A illustrated in FIG. 2.

The memory module packaging test system 200 may use the server system for the RDIMM. Thus, the module sockets SL1-A, SL2-A, SL1-B, and SL2-B mounted on the motherboard 31 may support an RDIMM interface. The test sockets TSL1-A, TSL1'-A, TSL1-B, and TSL1'-B mounted on the test board 33 may support a UDIMM interface. UDIMMs may be respectively inserted into the test sockets TSL1-A, TSL1'-A, TSL1-B, and TSL1'-B to test memory modules.

Figure 4:
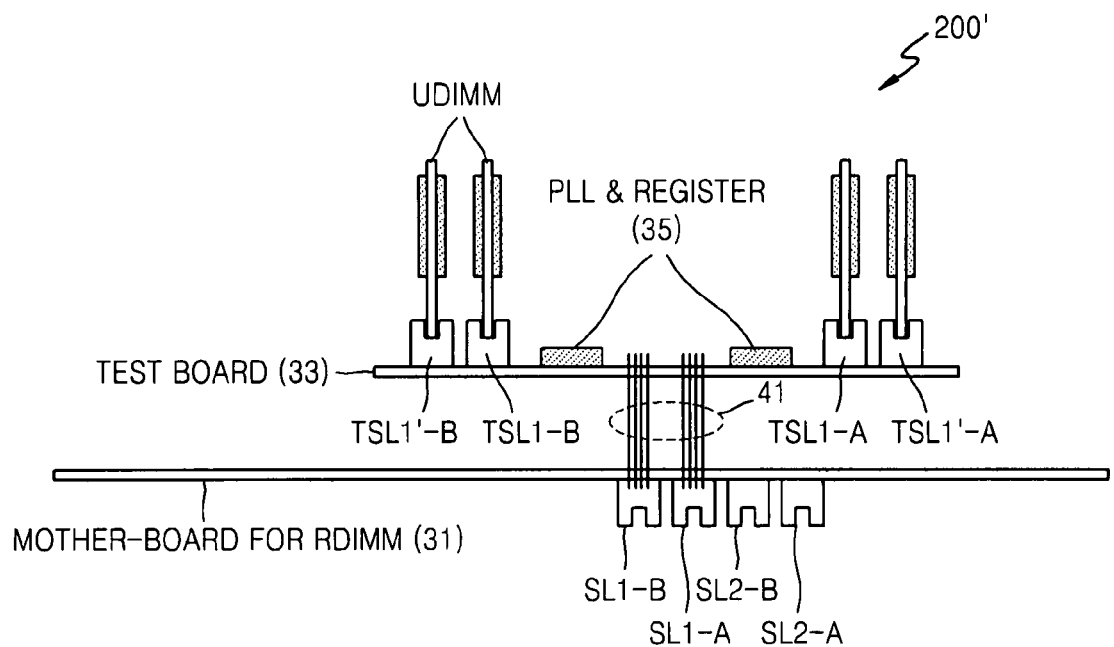
FIG. 4 is another example schematic diagram of a memory module packaging test system.

FIG. 4 is another example schematic diagram of a memory module packaging test system 200'. The memory module packaging test system 200' may use a server system for a RDIMM by modifying the server system. Referring to FIG. 4, the memory module packaging test system 200' may use a connector, a flexible printed circuit board (PCB), and/or a conductive steel core as a mechanism 41 for electrically connecting together the motherboard 31 and the test board 33. In the memory module packaging test system 200', the backside of the motherboard 31 may be connected to the bottom surface of the test board 33 via the mechanism 41. Here, the motherboard 31 may be turned upside down, as compared to the motherboard orientation depicted in FIG. 3.

Figure 5:
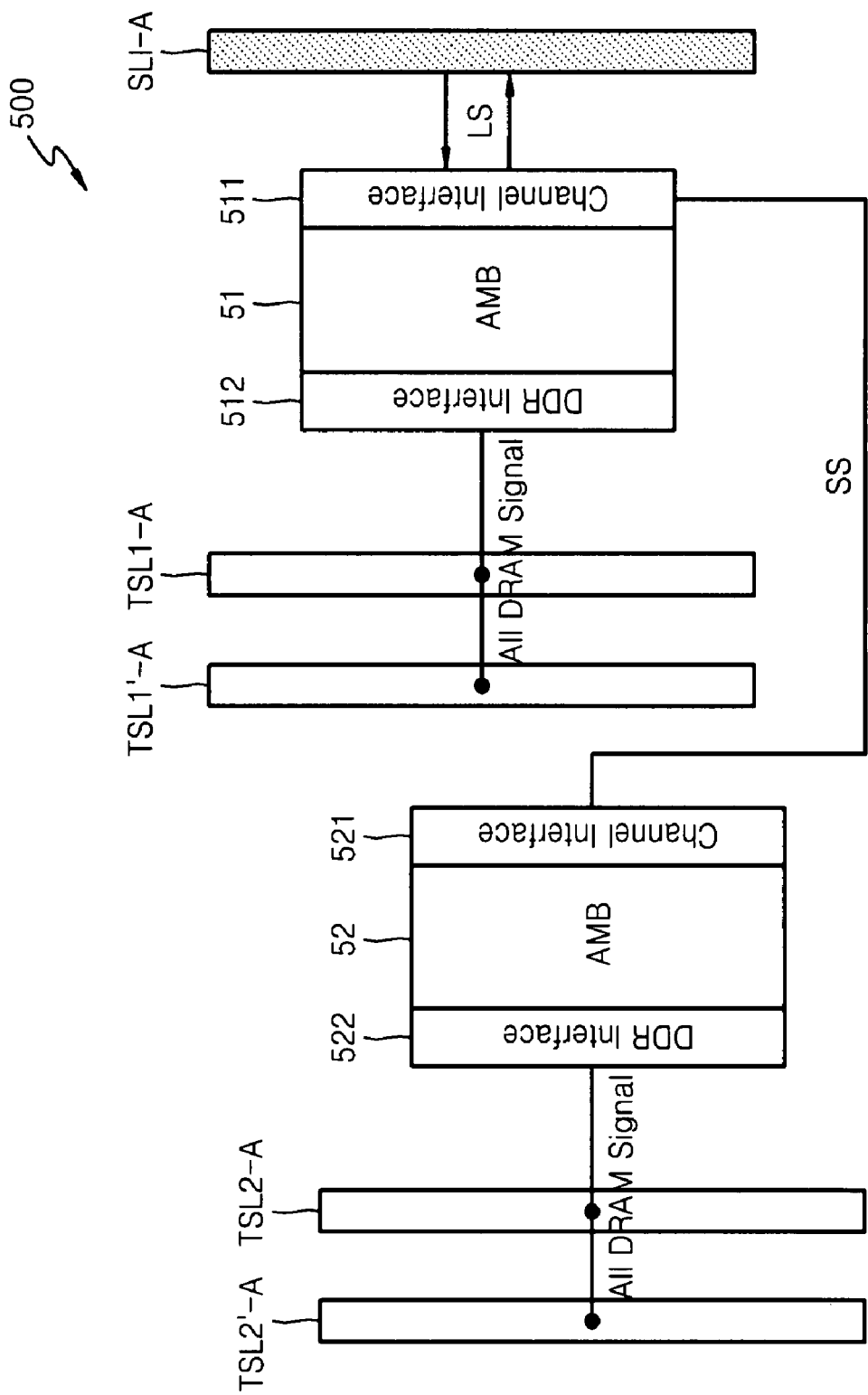
FIG. 5 is a schematic block diagram of a memory module packaging test system according to another example embodiment.

FIG. 5 is a schematic block diagram of a memory module packaging test system 500 according to another example embodiment. The memory module packaging test system 500 may use a server system for a fully buffered dual in-line memory module (FBDIMM) based on channel A illustrated in FIG. 1.

Referring to FIG. 5, in the memory module packaging test system 500, an advanced memory buffer (AMB) 51, which may be mounted in an FBDIMM, may be interconnected between a memory module slot SL1-A and test slots TSL1-A and TSL1'-A. The two test slots TSL1-A and TSL1'-A may be connected to a double data rate (DDR) interface 512 of the AMB 51, and may share signals from the memory module slot SL1-A via the AMB 51. In alternative embodiments, three or more test slots may be connected to the AMB 51.

The AMB 51 may communicate with the module slot SL1-A and link signals (LSs) via a channel interface 511. By way of example only, the LSs may have transmission characteristics of 4.8 Gbps and intrinsic protocols. A primary southbound (PS) signal transmitted to the AMB 51 via the channel interface 511 may be reconfigured to have a speed and protocol satisfying the DDR specification, and then driven using a DDR interface 512. The structural and functional aspects of the AMB 51 per se are well known to those skilled in the pertinent art, and thus a detailed description of the same is omitted.

The memory module packaging test system 500 may use a secondary southbound (SS) signal from the AMB 51 in a first stage as the PS signal of an AMB 52 in a second stage. In this way, another two test slots TSL2-A and TSL2'-A may be connected to the DDR interface 522 of the AMB 52. By way of example only, the protocol of the AMB 51 can use eight AMBs so that the memory module packaging test system 500 can include eight AMBs.

Therefore, eight AMBs and two test slots connected to each of the eight AMBs may result in sixteen test slots so that the memory module packaging test system 500 may simultaneously test sixteen UDIMMs inserted into the sixteen test slots, which may reduce the time required to test memory modules.

The memory module packaging test system 500 including the AMB 51 used for the FBDIMM may test the UDIMMs inserted into the test slots TSL1-A, TSL1'-A, TSL2-A, and TSL2'-A by operating them like the FBDIMM, even if the memory module slot SL1-A is used for the FBDIMM. By way of example only, the AMB 51 may operate up to 4.8 Gbps so that the memory module packaging test system 500 may test the UDIMM at 800 Mbps.

Figure 6:
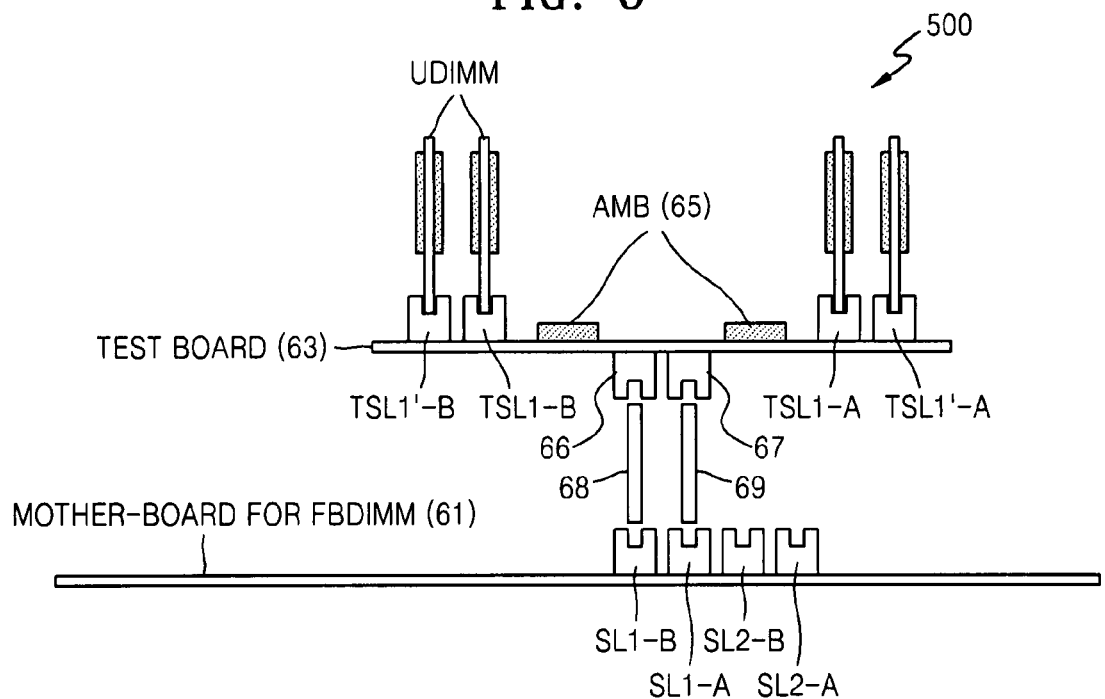
FIG. 6 is an example schematic diagram of a memory module packaging test system illustrated in FIG. 5.

FIG. 6 is a schematic diagram of the memory module packaging test system 500 illustrated in FIG. 5. The memory module packaging test system 500 may use a server system for a FBDIMM without any modification.

Referring to FIG. 6, the memory module packaging test system 500 may include a motherboard 61 for the FBDIMM. The motherboard 61 may support a plurality of module sockets SL1-A, SL2-A, SL1-B, and SL2-B. The memory module packaging test system 500 may also include a test board 63 that may support a plurality of test sockets TSL1-A, TSL1'-A, TSL1-B, and TSL1'-B into which UDIMMs may be respectively inserted. An AMB 65 used as the FBDIMM may be mounted on the test board 63.

The memory module packaging test system 500 may also include interface sockets 66 and 67 and interface boards 68 and 69 to electrically connect together the motherboard 61 and the test board 63. The interface sockets 66 and 67 may be disposed on the bottom surface of the test board 63, and may be electrically connected to the AMB 65 and the test sockets TSL1-A, TSL1'-A, TSL1-B, and TSL1'-B. The interface boards 68 and 69 may be inserted into the interface sockets 66 and 67 and the module sockets SL1-A, SL2-A, SL1-B, and SL2-B to provide an interconnection therebetween. In alternative embodiments, the AMB 65 may be mounted on the interface boards 68 and 69 (instead of the test board 63).

The module sockets SL1-A and SL2-A mounted on the motherboard 61 and the test sockets TSL1-A and TSL1'-A mounted on the test board 63 may be connected to channel A illustrated in FIG. 1. The module sockets SL1-B and SL2-B mounted on the motherboard 61 and the test sockets TSL1-B and TSL1'-B mounted on the test board 33 may be connected to channel B illustrated in FIG. 1. The module socket SL1-A may correspond to the memory module slot SL1-A illustrated in FIG. 5. The AMB 65 may correspond to the AMBs 51 and 52 illustrated in FIG. 5. The test sockets TSL1-A and TSL1'-A may correspond to the test slots TSL1-A and TSL1'-A illustrated in FIG. 5.

The memory module packaging test system 500 may use the server system for the FBDIMM. Thus, the module sockets SL1-A, SL2-A, SL1-B, and SL2-B mounted on the motherboard 61 may support an FBDIMM interface. The test sockets TSL1-A, TSL1'-A, TSL1-B, and TSL1'-B mounted on the test board 63 may support a UDIMM interface. UDIMMs may be respectively inserted into the test sockets TSL1-A, TSL1'-A, TSL1-B, and TSL1'-B to test memory modules.

Figure 7:
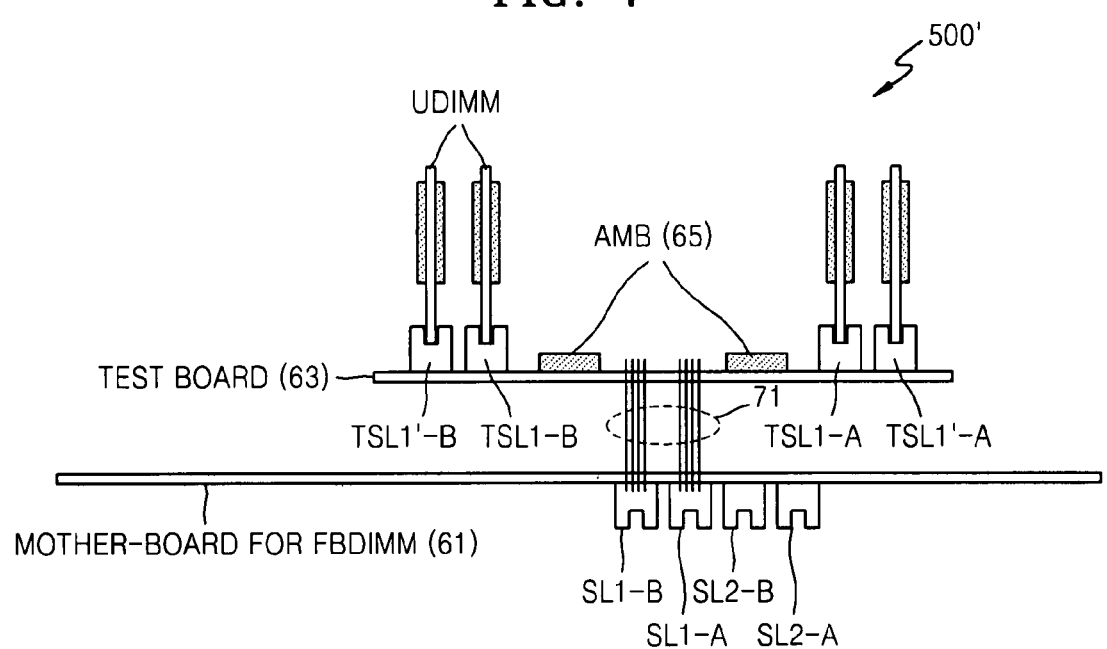
FIG. 7 is another schematic diagram of a memory module packaging test system.

FIG. 7 is another schematic diagram of a memory module packaging test system 500'. The memory module packaging test system 500' may use a server system for a FBDIMM by modifying the server system. Referring to FIG. 7, the memory module packaging test system 500' may use a connector, a flexible PCB, and/or a conductive steel core as a mechanism 71 for electrically connecting together the motherboard 61 and the test board 63. In the memory module packaging test system 500', the backside of the motherboard 61 may be connected to the bottom surface of the test board 63 via the mechanism 71. Here, the mother board 61 may be turned upside down, as compared to the motherboard orientation depicted in FIG. 6.

As described above, a memory module packaging test system according to example, non-limiting embodiments may install a plurality of memory modules in a plurality of test slots so that the system may simultaneously test the memory modules, which may reduce the time required to test memory modules. The memory module packaging test system may use a server system for a RDIMM and/or FBDIMM so that the system may test a UDIMM.

The present invention has been shown and described with reference to example, non-limiting embodiments thereof. It will be understood by those of ordinary skill in the art that various changes in form and details may be implemented without departing from the spirit and scope of the present invention as defined by the following claims.

What is claimed is:

1. A memory module packaging test system, comprising:
a motherboard including a module socket;
a test board including a plurality of test sockets into which memory modules are respectively insertable; and
a connector mechanism electrically connecting together the module socket of the motherboard and the test sockets of the test board; and
one of a phase locked loop (PLL) and a register, and an advanced memory buffer (AMB) electrically interconnected between the module socket and the plurality of test sockets,
wherein the one of the phase locked loop (PLL) and the register, and the advanced memory buffer (AMB) is mounted on the test board.

2. The system of claim 1, wherein the connector mechanism comprises:
an interface socket disposed on a surface of the test board; and
an interface board disposed between the interface socket and the module socket.

3. The system of claim 1, wherein the connector mechanism is one of a connector, a flexible printed circuit board (PCB), and a conductive steel core.

4. The system of claim 1, wherein the module socket of the motherboard supports a registered dual in-line memory module (RDIMM).

5. The system of claim 1, wherein the test sockets of the test board support unbuffered dual in-line memory modules (UDIMMs).

6. The system of claim 1, wherein the PLL and the register are mounted on the test board to correct characteristics of signals from the module socket.

7. The system of claim 1, wherein the AMB, which is used for a fully buffered dual in-line memory module (FBDIMM), is mounted on the test board.

8. The system of claim 7, wherein the connector mechanism comprises:
an interface socket disposed on a surface of the test board; and
an interface board disposed between the interface socket and the module socket.

9. The system of claim 7, wherein the connector mechanism is one of a connector, a flexible printed circuit board (PCB), and a conductive steel core.

10. The system of claim 7, wherein the module socket of the motherboard supports an FBDIMM.

11. The system of claim 6, wherein the test sockets of the test board support UDIMMs.

12. A memory module packaging test system, comprising:
a motherboard including a module socket;
a test board including:
- an upper surface supporting a plurality of test sockets into which memory modules are respectively insertable, and
- a bottom surface supporting an interface socket electrically connected to the test sockets;

an interface board disposed between the module socket of the motherboard and the interface socket of the test board, and one of a phase locked loop (PLL) and a register, and an advanced memory buffer (AMB) electrically interconnected between the module socket and the plurality of test sockets, wherein the one of the phase locked loop (PLL) and the register, and the advanced memory buffer (AMB) is mounted on the test board.

13. The system of claim 12, wherein a PLL and a register are mounted on a surface of one of the test board and the interface board to correct signal characteristics.

14. The system of claim 13, wherein the module socket of the motherboard supports an RDIMM.

15. The system of claim 14, wherein the test sockets of the test board support UDIMMs.

16. The system of claim 12, wherein an AMB used for an FBDIMM is mounted on a surface of one of the test board and the interface board.

17. The system of claim 16, wherein the module socket of the motherboard supports a FBDIMM.

18. The system of claim 17, wherein the test sockets of the test board support UDIMMs.

* * * * *